(12) United States Patent
Papananos et al.

(10) Patent No.: US 9,800,236 B2
(45) Date of Patent: Oct. 24, 2017

(54) INTEGRATED ANALOG DELAY LINE OF A PULSE-WIDTH MODULATOR

(71) Applicant: Infineon Technologies AG, Neubiberg (DE)

(72) Inventors: Yannis Papananos, Villach (AT); David Seebacher, Villach (AT); Nikolaos Alexiou, Villach (AT); Franz Dielacher, Villach (AT)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 14/936,959

(22) Filed: Nov. 10, 2015

(65) Prior Publication Data

US 2017/0134015 A1     May 11, 2017

(51) Int. Cl.
| | |
|---|---|
| *H03K 3/017* | (2006.01) |
| *H03K 7/08* | (2006.01) |
| *H03K 5/134* | (2014.01) |
| *H03K 5/00* | (2006.01) |

(52) U.S. Cl.
CPC .............. *H03K 7/08* (2013.01); *H03K 5/134* (2014.07); *H03K 2005/00026* (2013.01)

(58) Field of Classification Search
None
See application file for complete search history.

(56) References Cited

U.S. PATENT DOCUMENTS

| | | | |
|---|---|---|---|
| 6,556,415 B1 | 4/2003 | Lee et al. | |
| 9,054,940 B2 * | 6/2015 | Ma | H03F 1/3247 |
| 9,270,504 B2 * | 2/2016 | Koike-Akino | H04L 25/4902 |
| 2007/0035363 A1 | 2/2007 | Kameya | |
| 2007/0126529 A1 | 6/2007 | Chen | |
| 2007/0164837 A1 | 7/2007 | Hamet et al. | |
| 2007/0187804 A1 | 8/2007 | El Rai et al. | |
| 2008/0039332 A1 | 2/2008 | Bernstein et al. | |
| 2008/0119363 A1 | 5/2008 | Bernstein et al. | |
| 2016/0308524 A1 * | 10/2016 | Inoue | H02M 1/08 |

FOREIGN PATENT DOCUMENTS

JP     55125712 A     9/1980

OTHER PUBLICATIONS

U.S. Appl. No. 14/937,040, filed Nov. 10, 2015.
Nelson V. Silva, et al., Design and Optimization of Flexible and Coding Efficient All-Digital RF Transmitters, IEEE Transactions on Microwave Theory and Techniques, vol. 61, No. 1, Jan. 2013.

(Continued)

*Primary Examiner* — Lincoln Donovan
*Assistant Examiner* — Khareem E Almo
(74) *Attorney, Agent, or Firm* — Eschweiler & Potashnik, LLC

(57) ABSTRACT

A pulse width modulation (PWM) system comprises an analog component and a digital component. The analog component introduces an offset (i.e., a time delay) to analog signals being received at an input with a tuning operation that fine tunes in the analog signals in the analog (continuous time) domain. The analog component comprises an analog delay line comprising a plurality of analog delay components configured to introduce the time delay to the analog signals based on a model of a transmission line.

24 Claims, 13 Drawing Sheets

(56) References Cited

OTHER PUBLICATIONS

Pieter A. J. Nuyts, et al., A Fully Digital Delay Line Based GHZ Range Multimode Transmitter Front-End in 65-nm CMOS, IEEE Journal of Solid-State Circuits, vol. 47, No. 7, Jul. 2012.
Ashoke Ravi, et al., A 2.4GHz 20-40-MHz Channel WLAN Digital Outphasing Transmitter Utilizing a Delay-Based Wieband Phase Modulator in 32-nm CMOS, IEEE Journal of Solid-State Circuits, vol. 47, No. 12, Dec. 2012.
Shlomo Shlafman, et al., Variable Delay Transmission Lines in Advanced CMOS SOI Technology, 2014 IEEE Radio Frequency Integrate Circuits Symposium.
Kristen Purnell, et al., A Novel Phase Shifter Using a GAAS MESFET in Passive Configuration, 1996 IEEE MTT-S Digest.
Jen-Chieh Wu, et al., 2.45-GHz CMOS Reflection-Type Phase-Shifter MMICS With Minimal Loss Variation Over Quadrants of Phase-Shift Range, IEEE Transactions on Microwave Theory and Techniques, vol. 56, No. 10, Oct. 2008.
Mohammad E. Heidari, et al., All-Digital Outphasing Modulator for a Software-Defined Transmitter, IEEE Journal of Solid-State Circuits, vol. 44, No. 4, Apr. 2009.
Zdravko Boos, et al., A Fully Digital Multimode Polar Transmitter Employing 17B RF DAC in 3G Mode, 2011 IEEE International Solid-State Circuits Conference.
Ilkka Hakala, et al., A 2.14-GHz Chireix Outphasing Transmitter, IEEE Transactions on Micorwave Theory and Techniques, vol. 53, No. 6, Jun. 2005.

* cited by examiner

INTEGRATED ANALOG DELAY LINE OF A PULSE-WIDTH MODULATOR

BACKGROUND

All-digital solutions for modern wireless communication systems pose significant benefits in terms of flexibility, re-configurability and power consumption reduction. Pulse-width modulation (PWM) can be important for the implementation of such systems. The phase shifting block is the core element for implementing phase or time offset operations in the PWM hardware. State-of-the-art, nm-scale CMOS technologies exhibit a gate delay of a few ps. This time delay resolution is directly associated with the dynamic range performance of the transmitter system, similar to the number of bits in analog-to-digital A/D converters or digital-to-analog D/A converters. In order to further reduce the resolution step, very expensive modern fine-node CMOS technologies are often used and there is a need for simpler, less expensive components.

DETAILED DESCRIPTION

Figure 1:
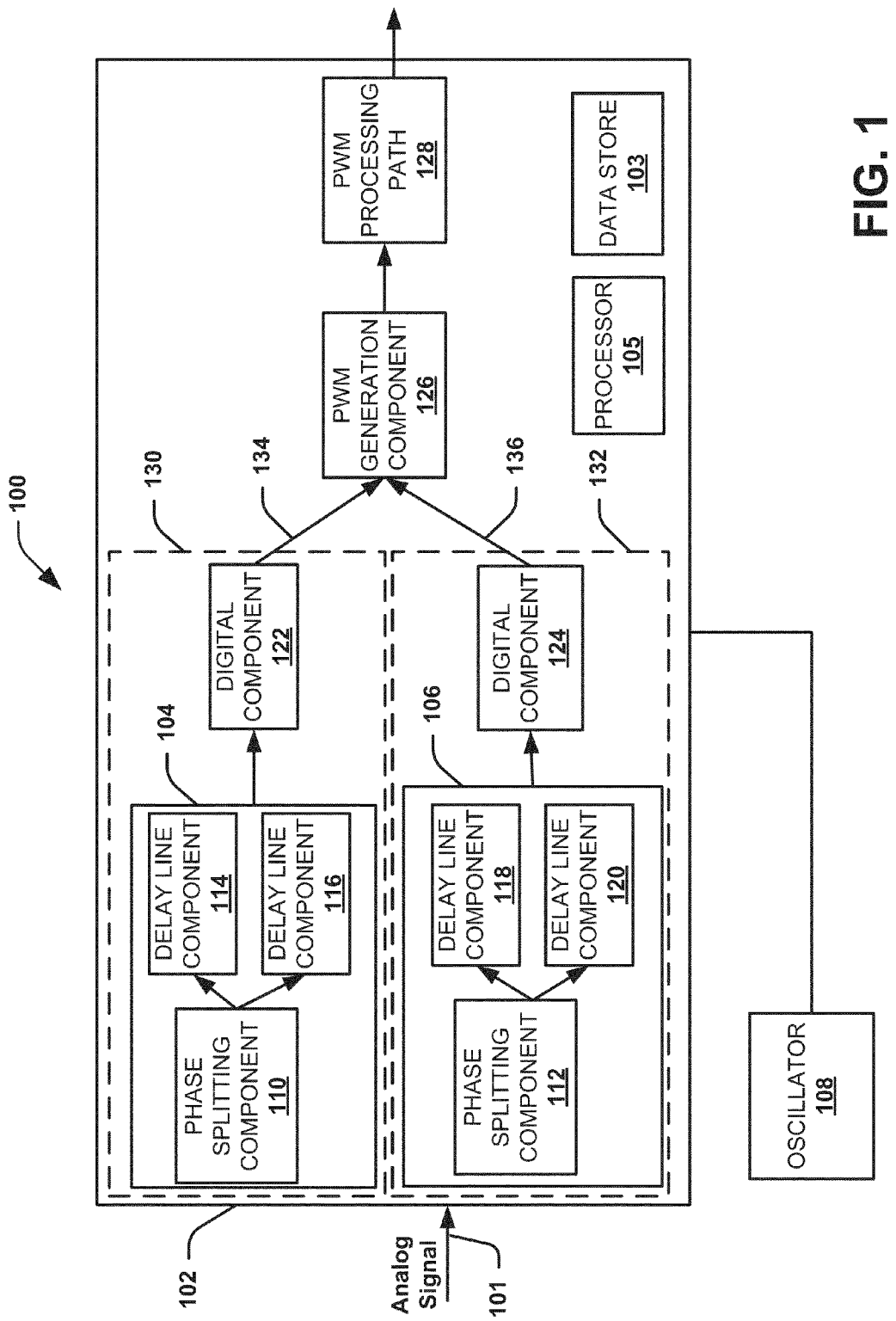
FIG. 1 illustrates a PWM system in accordance with various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies and continued objectives, various aspects for mixed analog-digital PWMs to further improve the time delay resolution are disclosed. For example, an analog-centric approach is implemented based on a model of a traditional transmission line in order to consolidate the coarse tuning and the fine tuning operations of time shifting into just one tuning (fine) operation with a fine tuning resolution (e.g., less than 2 picosecond, or less than a picosecond). The performance of the PWM device is thus not limited by the technology node performance (gate delay) any more, as it is with an all-digital PWM. Because the delay component comprises passive elements, it does not consume any power in contrast to all-digital implementations, which not only consumes power, but also, this power is heavily dependent on the carrier (switch) frequency of the telecommunication application.

In one example, the PWM modulator (e.g., a mixed analog-digital PWM device/transmitter) disclosed herein can process continuous waveforms (CW) (sinusoidal signals), which do not comply with the digital nature of the PWM transmitter. The PWM device can provide the time delay in the analog domain of processing with a single time resolution operation, and thus combine both coarse tuning and fine tuning into only one process or single level processing chain, which can be employed entirely by the analog component via one or more analog delay lines. The one or more analog delay lines can improve spectral purity performance at the output of the PWM device by facilitating the introduction of a time delay in predetermined or desired resolution within the analog (continuous time) domain. The PWM device can comprise an analog component and a digital component for generating PWM signals, which can be further powered or amplified by a driver to be transmitted via an antenna.

In another example, the analog delay line includes a chain of analog delay components that includes a chain of inductors coupled together in a daisy chain configuration or in series at their U shaped end points. For example, the chain of inductors can comprise rows that mirror one another via hair-pin connections at an inter-node, or a current summing node. The inductors of the daisy chain configuration can each be structured as a hair-pin inductor that comprises a U-shaped bent along one axis and are connected in series along another axis at their respective U-shaped ends.

Control and routing signals can be further provided to each inter-node between the inductors of the analog delay line/chain in order to selectively activate a number of analog delay components of the analog delay chain based on the desired time delay to be implemented to the analog inputs signals. The time delay can be selected across the analog delay line according to the time delays of each analog component. A point along the analog delay line can be selectively and independently activated along the analog delay line corresponding to the selected time delay for the analog delay line. The offset can thus be selectively controlled and introduced into the analog signals during the analog domain of the PWM device, which replaces a two stage tuning process of coarse tuning and fine tuning of other PWM devices. The analog delay lines can thus provide an analog output signal based on the offset or time delay, for example, which can be further processed in a digital domain while maintaining the time delay with the tuning resolution introduced in the analog domain at the analog component of the PWM device. Additional aspects and details of the disclosure are further described below with reference to figures.

FIG. 1 illustrates an example of a PWM modulation system 100 comprising a mixed analog-digital PWM device 102 that operates to provide an offset (e.g., a time delay or phase offset) to an analog signal while also controlling the resolution of a PWM device in a single operational step. The analog-digital PWM device 102 can operate to process an analog signal at an input 101 and further provide the offset according to a reference frequency signal or carrier signal from a local oscillator 108. The analog-digital PWM device 102 includes first and second analog components 104 and 106 that correspond to first and second digital components 122, 124, respectively, which form different communication channels 130, 132 of the PWM device 102. The PWM modulator device 102 can further include a processor 105, a data store 103, and the oscillator 108.

The processor 105 can be a baseband processor, a controller, digital signal processor or the like that operates to facilitate signals for communication via one or more devices such as the PWM modulator device 102, which can be a mobile phone, a personal digital assistance, a transceiver device or any device that communicates or processes signals for transmission, as a wireless or a wired device or system. The data store 103 can store one or more executable instructions, which can be executed via the processor 105 and be used to store offset information, timing data or other information to facilitate PWM processing.

The first and second analog components 104 and 106 can receive an oscillator signal from a local oscillator 108 as a reference or a carrier signal for processing analog signals in a continuous wave or continuous time domain. The first and second analog components 104 and 106 can also operate to separate signals from the local oscillator into different phase shifts along a three-hundred sixty (360) degree range and provide analog signals having a time delay associated with a dynamic range of the transmitter device or the local oscillator frequency. The time delay of all-digital systems is typically set with both a coarse tuning operation and then further calibrated with a fine tuning operation.

In one embodiment, the first and second analog components 104 and 106 can operate to provide such delay in a resolution that satisfies (above or below) a predetermined threshold in only the analog domain alone and provides the tuning operation in one step, one processing hierarchy, or analog pipeline/chain. The resolution of the time delay for example can be less than 2 picoseconds or less, (e.g., between about 1 picosecond to about 2 picoseconds), or less than one picosecond ($10^{-12}$).

The first and second analog components 104 and 106 can operate to process different portions or phases of analog signals via one or more analog delay line components 114-120, which can generate arbitrarily small delays. For example, the first and second analog components 104 and 106 can process signals along an entire spectrum of phases (360 degrees) and each comprise a pair of delay lines, in which one delay line process signals in two quadrants, while another delay line processes signals in the other two quadrants. These delay line pairs 114-120 can be combined to form a first part of an analog signal for conversion into a PWM cycle with a duty cycle up to or below fifty percent (e.g., 0 to 50%) downstream via the digital components 122 and 124, which is part of the digital domain of the PWM signal generation.

In addition or alternatively, the first and second analog components 104 and 106 can control the entire three hundred and sixty degree range of phase shifting via one analog delay or separated into different analog delay lines corresponding to a different division or portion of the input analog signals 101. Another different pair of delay lines, for example, can process signals comprising zero and one hundred and eighty (180) degrees also, while another pair of delay lines downstream coupled thereto can process signals between ninety and two-hundred and seventy degrees. Each analog line of the pair of analog delay lines of each delay line component 114-120 can then further process a separate quadrant or other division, for example, in which additional details and aspects are described infra with reference to FIG. 2.

Alternatively or additionally, the one or more analog delay lines 114-120 comprising delay components or gates configured to provide a time delay or offset at various points to modulate the analog signal to a fundamental delay based on the oscillator 108. The delay components or gates can be programmed according to a control signal to the delay line that can be implemented via one or more multiplexers coupled to different locations of the analog delay lines 114-120. The analog delay lines 114-120 can encompass and entire three hundred sixty degree phase shift range in one long line or, as discussed above, be processed with a plurality of delays lines according to different phase shifts of the carrier signal from the oscillator 108.

The PWM device 102 receives one or more analog input signals 101, including an oscillator signal via the oscillator 108 in order to generate an offset in the signals based on an operating frequency for an application. The first channel 130 forms a signal processing pathway that facilitates the generation of a PWM signal along with an output of the second channel 132. For example, the PWM generation component 126 receives digital square pulses 134 and 136 and then provides a PWM signal to the PWM processing path 128 to be processed further by one or more components (e.g., a driver, a filter, an antenna or the like).

In another embodiment, the PWM generation component 126 can comprise a logic array or gate (e.g., an AND gate) that combines the digital square pulses 134 and 136 to generate a PWM signal for transmission. The square pulses 134 and 136 can comprise the offset or time delay that was previously introduced in the analog domain. The digital components 122 and 124 maintains the delayed signals in a resolution that satisfies the predetermined threshold, which is established or introduced in the analog domain or continuous (sinusoidal) domain of the channel 130 or 132, such as below 2 picoseconds, or less than a picosecond. The digital pulse signals 134 and 136 can each have a duty cycle up to or below fifty percent (e.g., 50%), and provide different phases for the generation of the PWM signal by the PWM generation component 126 to be transmitted for an application (e.g., power control, communication of data or the like) based on a frequency of operation.

The communication processing channels 130 and 132 respectively comprise first and second analog delay lines 114 and 116, and third and fourth analog delay lines 118 and 120. The first and second phase splitting components 110 and 112 of the corresponding channels 130 and 132 are configured to receive the local oscillator signal as an analog signal from the oscillator 108, and provide an analog signal to the digital components 122 and 124, respectively. The digital components 122, in turn, provide the digital square wave pulses having the same fine tuning resolution introduced in the analog domain or continuous time domain, which can be less than one picosecond delay.

The phase splitting components 110 and 112 can operate to preserve space on a single die/substrate, or one or more dies/substrates, comprising the PWM device 102 and corresponding components. For example, the phase splitting components 110 and 112 can enable each channel 130, 132 to process different analog signals with different phase shifts in parallel. The phase splitting components 110 and 112, for example, are configured to receive the carrier signal of the local oscillator 108, and further provide phase shifted carrier signals to the first and second channel lines via the analog components 104 and 106.

The first and second analog components 104 and 106 each comprise a first (analog) delay line component 114, 118 and a second (analog) delay line component 116, 120, respectively, that are analog components configured to process different phase shifted analog signals. For example, the first phase splitting component 110 can process a signal from zero to three hundred and sixty degrees in order to process signals of one phase, and the second phase splitting component 112 can process the signal from zero to three hundred and sixty degrees in another phase to form a differential processing paths among the two channels 130 and 132 for processing the entire three hundred and sixty degree range at a different shift in a duty cycle that is up to or below 50% (e.g., at a 50% duty cycle or lower for each processed analog or digital processing line).

The delay line components 114 thru 120 can each generate a selected phase delay within the input signals at a fine tuning resolution provided in the analog signals, which is carried through into the digital domains without further tuning operations being implemented in the PWM device 102. Each of the delay lines 114 thru 120 can receive a different quadrature phase analog signal generated via corresponding phase splitting components 110 and 112. The first delay line component 114 can receive first analog signals having phase shifts along one quadrant of the entire phase range. The second delay line component 116 can receive second analog signals having phase shifts that are along another different quadrant of the entire phase range. Likewise, at a different phase of a duty cycle, the third delay line component 118 can receive third analog signals having a different phase shift that are along one quadrant of the entire phase range, and the fourth delay line component 120 can receive fourth analog signals having a different phase shift that is along another quadrant of the entire phase range. Although two different channels 130 and 132 are illustrated with different delay line components for different quadrature, the delay lines components could process signals along the entire three hundred sixty degree range, or at different divisions of an entire phase range other than quadrants, such by octants (eighths) or other phase division of a phase sector.

Each of the analog delay lines 114, 116, and 118, 120 of the analog components 104 and 106 provide an analog output signals to digital components 122 and 124, respectively. The digital components convert the analog signals having the time delay generated at a fine tuning resolution of less than one picosecond. The digital components 122 and 124 then provide different phases of digital signals or square pulses to the PWM generation component while maintaining preserving the time delay at the same resolution as set in the analog delay lines 114 thru 120.

An advantage of the PWM system 100 is that it combines the benefits of both worlds: analog and digital for the design of the PWM modulator device 102, making it a mixed analog-digital PWM modulator. The analog world/domain can be utilized for a flexible implementation of the fine-resolution time step delay lines and the digital world/domain for the actual implementation of the PWM signal in a simple and cost-effective way.

In order to further improve the time delay resolution of the PWM device 102, an analog-centric approach is proposed. Specifically, the PWM device 102 has an advantage of the operations and processes being based on the properties of traditional transmission lines. Thus, the performance of the PWM device 102 is not limited by the technology node performance (gate delay) any more. This means that low resolution steps are now achievable (e.g., a 2 picosecond step or below) at no extra cost. An additional advantage of the proposed solution is that because the basic delay components within the analog delay lines 112 comprises passive elements only, the one or more delay lines 114-120 do not consume any power in contrast to digital implementations that not only consumes power, but the power is heavily dependent on the carrier (switch) frequency of the telecommunication application. These components can thus comprise an arbitrarily or predetermined small resolution scale in their operation. Inevitably, the transmission line-based a PWM device 102 makes it a mixed anal-digital PWM that is processing continuous wave (sinusoidal) signals that do not comply with the digital nature of the PWM (transmitter). In order to solve this issue, the mixed analog-digital PWM device 102 provides the fine and coarse time resolution in one process step that is employed by the analog delay lines 114-120 of the analog component 110 in the continuous wave domain leading to an improved spectral purity performance at the output 116 of the modulator.

Figure 2:
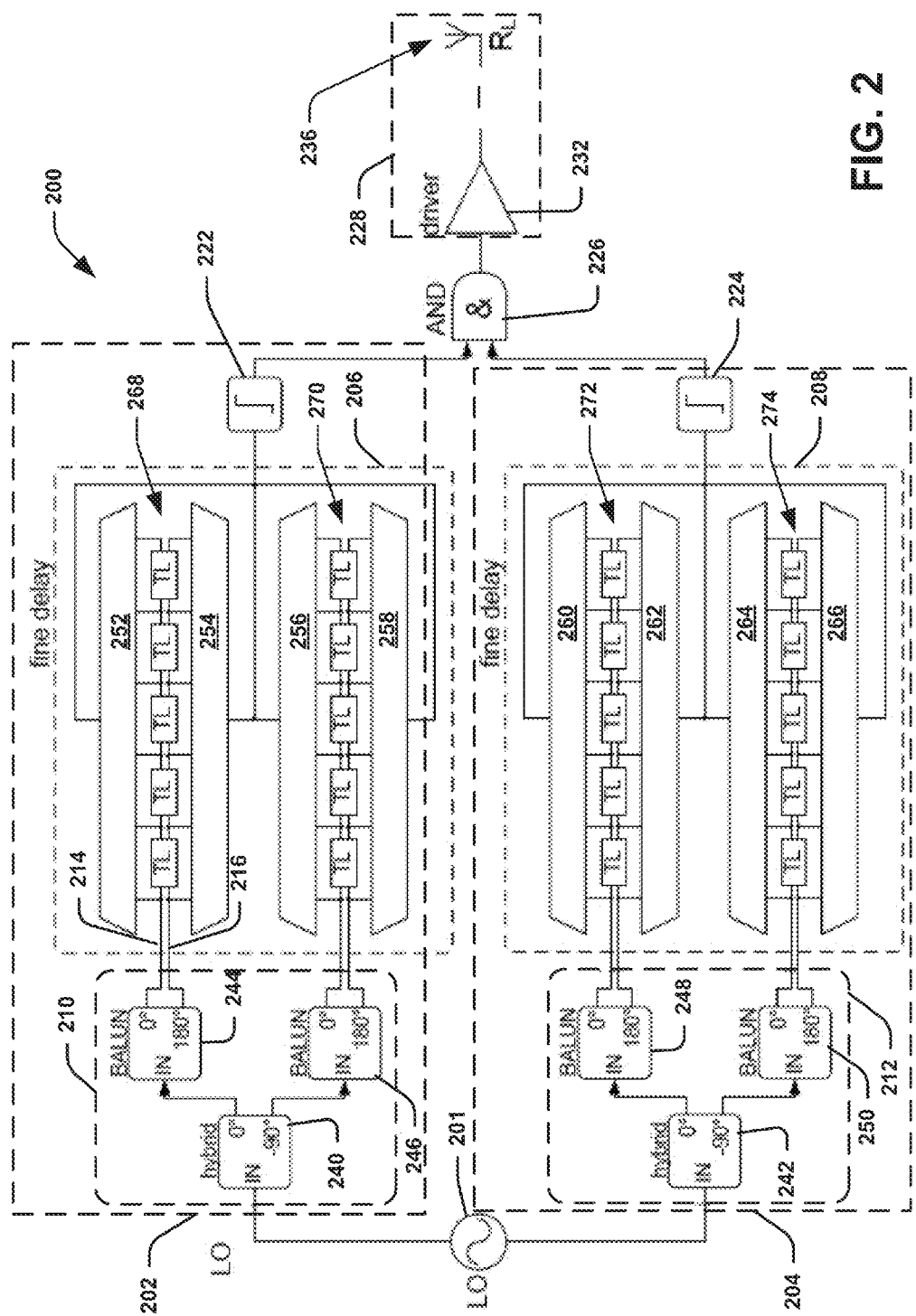
FIG. 2 illustrates an example of the PWM system in accordance with various aspects described.

Referring to FIG. 2, illustrated is another example of a PWM modulator device 200 in accordance with various aspects being disclosed. The device 200 comprises similar components as discussed above with regard to the PWM device 102 of FIG. 1. The device 200 comprises a first communication channel 230 and a second communication channel 232. A local oscillator 201 provides an analog oscillator signal to the channels 230 and 232, in which the phase splitting components 210 and 212 operate to generate a different phase shift to the carrier signal and provide the analog signals to different analog components 206 and 208 with the different phase shifted carrier signals. For example, the different analog signals can be quadrature shifted according to four different analog delay lines 268-274. Although quadrature shifts are illustrated for processing along corresponding analog delay lines 268-274 other phase shifts and a different number of corresponding delays lines can also be implemented.

For example, the first phase splitting component 210 can be configured to provide a first phase quadrature signal with a first phase shift within a first quadrant (e.g., zero degrees) and a second phase quadrature signal comprising a second phase shift within a third quadrant (e.g., 180 degrees). The first phase splitting component 210 can also provide quadrature signals (e.g., third and fourth quadrature signals) to the second analog delay line 270, which are different in phase from the analog signals received at the first analog delay line 268. The second analog delay line 270 receives analog signals within a second quadrant (e.g., 90 degrees shifted) and a fourth quadrant (e.g., two hundred and seventy degrees). As such, an entire phase spectrum in degrees, for example, can be processed along the pair of analog delay lines 268 and 270 at a duty cycle (e.g., 50%) to compliment and similarly process a shifted portion of the analog signals, including the LO carrier, as the second phase splitting component 212 of the second channel 204.

The second phase splitting component 212 operates similarly as the first phase splitting component 210, but with a different portion or inverse of the LO signal from the local oscillator 206. The second phase splitting component 212 can be configured to provide quadrature signals with different phase shifts to third and fourth analog delay lines 272, 274 of the second channel 208. The second phase splitting component 212 can be configured to provide different quadrature signals with a different phase shifts to the third and fourth analog delay lines 272, 274 to further process analog signals that can be inverse signals at duty cycles up to or below fifty percent (e.g., 50%) with respect to the first channel 206.

In another embodiment, the first phase splitting component 210 and the second phase splitting component 212 each comprise a first quadrature component 244 and 248, a second quadrature component 246 and 250, respectively. Each pair of first and second quadrature components 244, 246 and 248, 250 can comprise one or more baluns and are respectively coupled to a hybrid component 240 and 242, which can comprise LC Lange couplers, for example. The original sinusoid carrier (LO signal) is split into quadrants, for example, by the first and second quadrature components 244-250, which can comprise silicon integrated balanced-to-unbalanced (balun) transformers, for example. The baluns 244-250 and the hybrid components 240, 242, which can comprise LC Lange Couplers, are configured to provide 90° phase shifting. This way, each analog delay line 268-272 processes only one quadrant instead of full 360° shifting making the analog components 206 and 208 significantly smaller and thus immune to wiring parasitics and mismatches.

In another embodiment, the analog components 206 and 208 introduce time delays into the respective phase shifted analog signal at a resolution that is set to be below a predetermined threshold, such as about 2 picoseconds or less for the analog components 206 and 208, respectively. The offsets (phase shifts or time delays) introduced by the analog delay lines 268-274, for example, can be one or more small delay steps at various locations depending on the TL or delay components coupled in series, which operate in steps at a fraction of a picosecond. The delay components of each delay chain 268-274 can combine to provide a total resolution of each delay line or of the device 200 overall, which can be less than 2 picoseconds, with each step less than a picosecond. Thus, each delay component of a delay chain 268 through 274 can have a small arbitrary delay that is less than a picosecond. The resolution of the time delay, either in combination or individually, provides the level at which the different phase shifted signals are selected to correspond with the analog carrier (LO) signal in order to set the sinusoidal analog signals based on a particular application frequency, for example.

The analog delay lines/chains can comprise a number of analog limiter blocks TL followed by a number of digital inverter or limiter blocks 222 and 224 connected in cascade thereat, which can comprise digital inverters that can be reduced by dividing the processes into quadrants or other fractions of the entire phase spectrum in degrees or radians, for example. Although, the analog delay lines 268-274 could also be combine to form longer chains for process halves or the full, complete spectrum as well.

Each analog delay line 268-274 can comprise a first (top) multiplexer 252, 256, 260, and 264, respectively, and a second (bottom) multiplexer 254, 258, 262, and 266, respectively. The multiplexers 252-266 operate respectively to select the phases of the analog signal for introducing delays via the delay components TL coupled in a series. The first (top) multiplexer 252 can be coupled to a first delay processing line 214 of the analog delay line 268, for example, which can be a differential delay line, and the second (bottom) multiplexer 254 can be coupled to a second processing delay line 216 of the analog delay line 268. The same configuration with first and second processing delay lines can be repeated for the second, third and fourth analog delay lines 270, 272, and 274 also. Although a differential analog delay line is illustrated, a single-ended version can also be implemented as an alternative or in addition to other configurations.

Each pair of analog delay lines 268, 270 and 272, 274 can be coupled to one another. For example, the first (top) multiplexer 252 of the analog delay line 268 can be connected to the second (bottom) multiplexer of the second analog delay line 270. In addition, the first (top) multiplexer 256 of the second analog delay line 270 can be connected to the second (bottom) multiplexer 254 of the first analog delay line 268. Further, the first (top) multiplexer 260 of the third analog delay line 272 can be connected to the second (bottom) multiplexer 266 of the fourth analog delay line 274, and the first (top) multiplexer 264 can be connected to the second (bottom) multiplexer 262. Likewise, each of these connections can be coupled together within each pair of analog delay lines 268, 270 and 272, 274 respectively, and provide the analog signals having the desired time delay in a resolution of less than 2 picoseconds to a digital phase of the processing, at the digital components 222 224.

Figure 3:
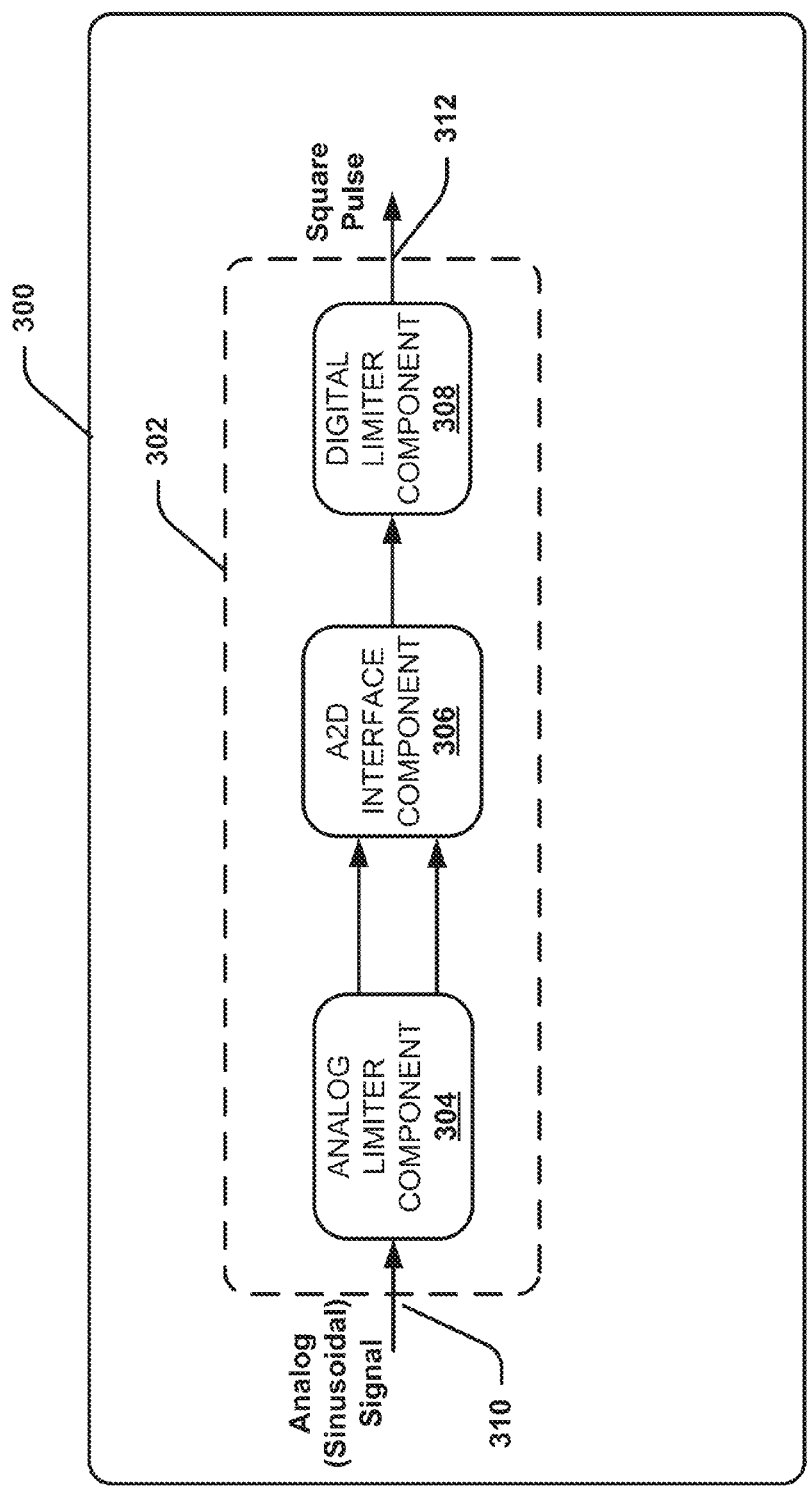
FIG. 3 illustrates an example of a digital component in accordance with various aspects described.

The analog (sinusoidal) signals with the time delay with a certain resolution are then outputted to corresponding digital components 222 and 224, which are further detailed below in FIG. 3. The digital components 222 and 224 can include analog to digital interface chains coupled to digital limiters (as illustrated in FIG. 3). The digital components 222 and 224 bias the analog signals and increase the amplitude in order to correspond with the digital limiter components thereat. These signals can be analog to voltage level square waves, for example. The digital components 222 and 224 provide digital square waves or digital square pulses to the PWM generation component 226 while maintaining the resolution of the single tuning step or stage of the analog components 206 and 208 in these signals. The PWM generation component 226 further generates a PWM signal from the squares waves or pulses based on a duty cycle up to or below fifty percent (e.g., 50%) with the time delay at the resolution provided by the fine tuning operation of the analog components 206 and 208 being preserved.

In another embodiment, a conversion of the continuous time or continuous wave signals is processed by the analog delay lines 268, 270, 272 and 274 to digital pulses readily available for logic operations necessary to generate PWM signals via the logic gate 226 (e.g., an AND gate or other logic operation gate). For such a continuous wave to pulse wave conversion, a chain of digital limiter cells can be employed as the digital components 222 and 224, which also can be connected to a chain of analog delay components or analog delay limiters TL in a series connection of each analog delay line 268-274. The output of the analog delay components TL coupled in series to form the analog delay lines 268-274 is a small-signal sinusoid that can then be converted to a digital (0 to VDD) pulse, for example.

The output of the digital limiter chains 222 and 224 exhibits a high driving capability as the final PW modulated signal can be configured to drive a 50-Ohm load. The digital limiter chains 222 and 224 can be implemented in pair in order to accommodate the two out-phasing signals or the analog output signals from the analog delay lines 268, 270, and 272, 274 of each channel 204 and 206. Following the digital limiter chains of the digital components 222 and 224, a fast, high driving capability AND gate 226 can be used to generate the PW signal from nominal 50% duty cycle square pulses.

Referring to FIG. 3, illustrated is an example configured of digital components (e.g., digital components 222 and 224 of FIG. 2) that processes analog signals in a PWM device or PWM system according to various aspects being disclosed. The mixed analog digital PWM device 300 is similar to the PWM devices discussed above, which provides interface between the analog time-shifted signals 310 being outputted by the analog components (e.g., analog 206, 208 of FIG. 2) and the operation of a PWM component (e.g., AND gate 226) in a way that the fine time resolution step achieved in the continuous wave domain is maintained throughout the generation of the square pulses 312.

The outputs of the analog components 206 and 208 are still a sinusoid and are further converted to square pulses 312 in order for the PWM signal to be generated within the PWM component 226 as a logic gate, array of logic gates or the like (e.g., an AND gate). For this purpose, the digital component 302, representing digital components 222 or 224, can each comprise a chain of limiting amplifiers. The digital component 302 comprises three main parts: an analog limiter 304, an analog-to-digital limiter interface 306 and the purely digital limiter 308.

The analog limiter 304 can be a chain of analog limiters coupled in series or another configuration, which receives a small amplitude sinusoid. The analog limiters can operate as an analog amplification unit comprising cascaded differential pairs that are used to increase the signal amplitude towards a rail-to-rail voltage. The analog chains are implemented in pair in order to accommodate the two out-phasing signals from the analog components 206 and 208. Then, the analog-to-digital interface 306 receives a differential signal from the analog limiter component 304 and operates to control biasing between the analog and the digital parts of the signal.

Subsequently, the digital limiter component 308 can be a chain of CMOS inverters 308 that are configured to provide the outputs 312 as the final rail-to-rail square pulses to feed the inputs of the PWM generator component (e.g., digital AND gate 226). The chain of the digital inverter(s) or the digital limiter component 308 exhibits an increased driving capability as the final AND gate 226 receives to operate extremely fast with the minimum possible rise and fall times and also to provide load driving capability, such as a 50-Ohm driving load capability.

Figure 4:
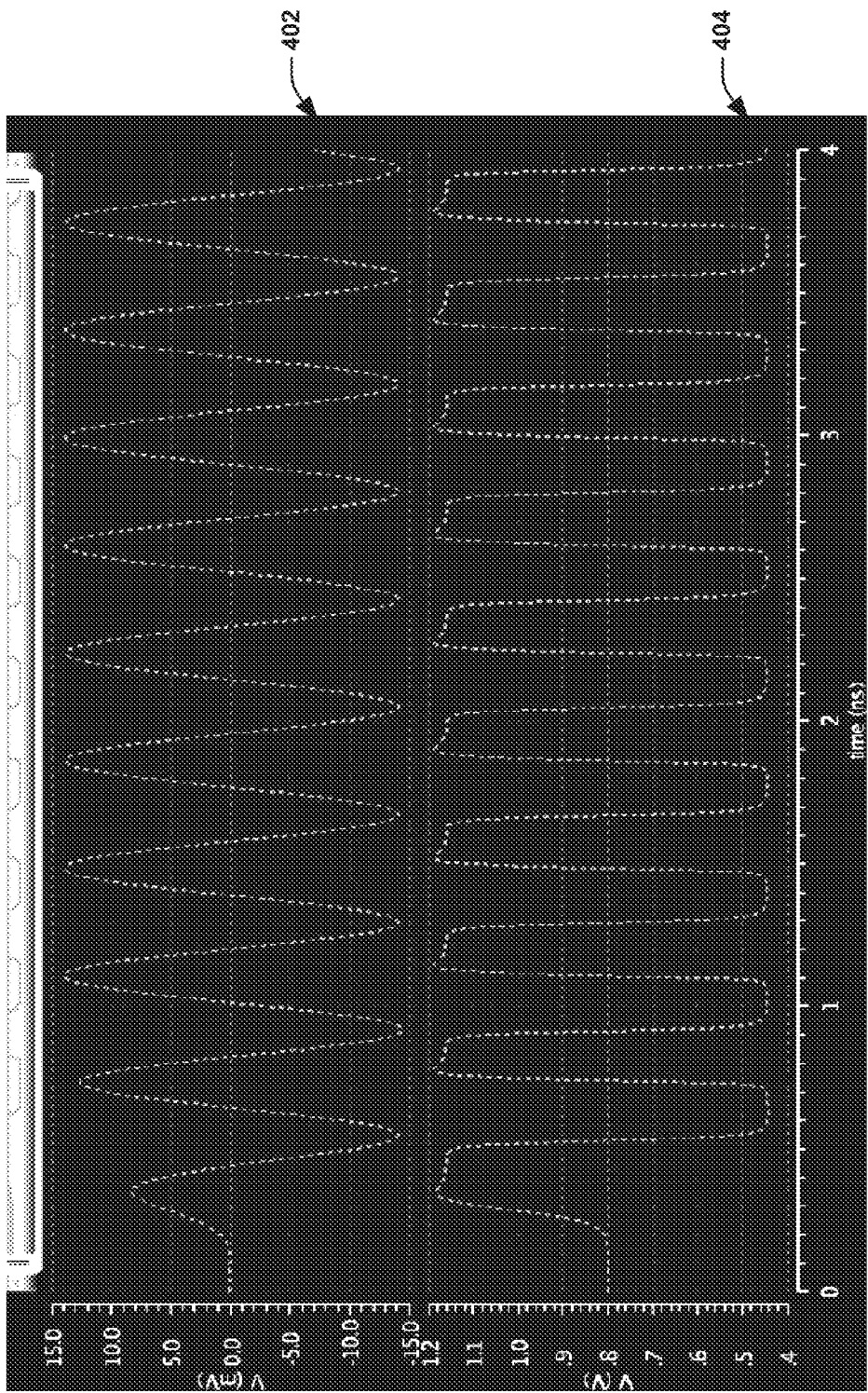
FIG. 4 illustrates a graph of input analog signals and an analog square wave in accordance with various aspects described.

Referring to FIG. 4, illustrated is an example of an analog signal waveform in the continuous time domain. Here, a small-signal sinusoid 402 is converted to an analog non-zero biased square pulse 404. As described above, the signal from the analog components 206 and 208 is a continuous analog signal that has been introduced with a desired time delay in a resolution that is less than about 2 picoseconds total, or a fraction at each delay component. The analog limiter 304 receives the small amplitude sinusoid, which is smaller in amplitude than the signal outputted by the analog limiter to analog-to-digital interface 306. Then, the analog-to-digital interface 306 receives a differential signal from the analog limiter component 304 and operates to control biasing between the analog and the digital parts of the signal. The output of the analog-to-digital interface 306 comprises the analog non-zero biased square pulse 404 without a constant duty cycle, but has a higher value and a lower value.

Figure 5:
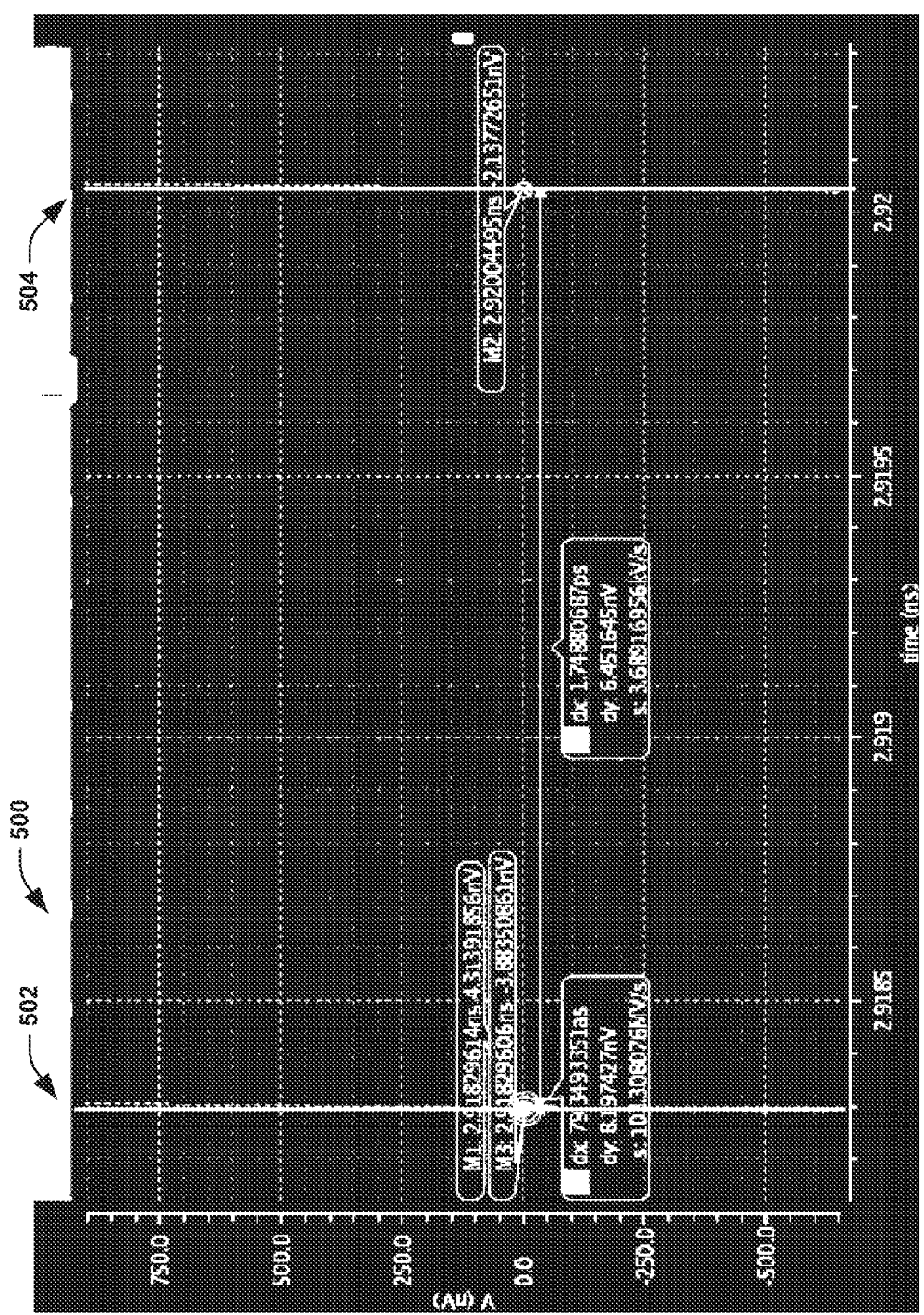
FIG. 5 illustrates a graph of the resolution of a time delay introduced in the analog domain in accordance with various aspects described.

FIG. 5 illustrates an example of the time unit step performance of the PWM devices disclosed herein. As can be seen, a step below 2 picoseconds ($10^{-12}$) or less than 1 picosecond can be achieved, in which the difference is illustrated in the delay between two signal portions 502 and 504 introduced via the analog components 206 and 208. Carrier frequency is at 2.65 GHz.

Figure 6:
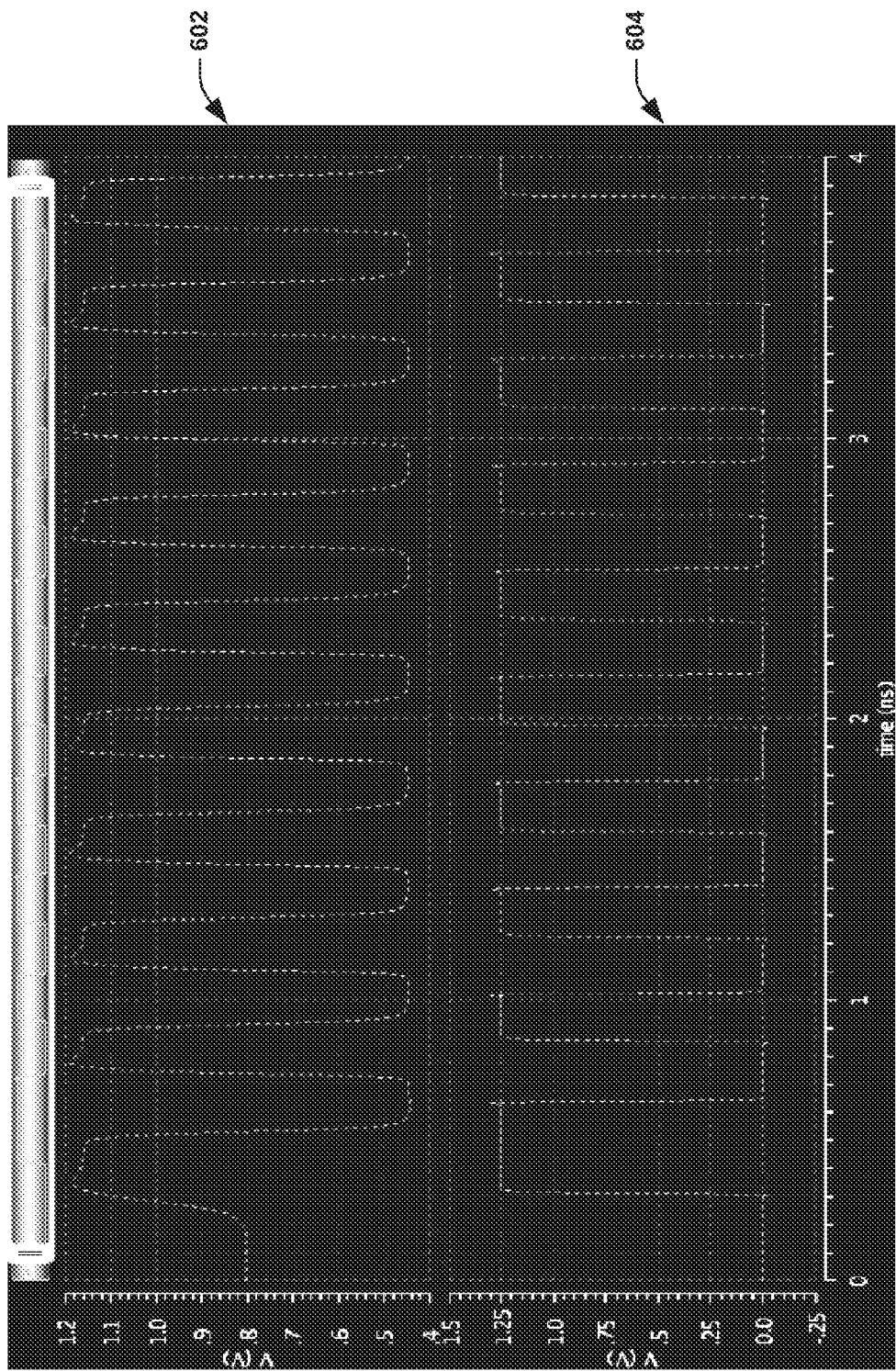
FIG. 6 illustrates another graph of an analog square wave and a digital square pulse in accordance with various aspects described.

FIG. 6 illustrates the final operation of the one or more digital limiters 308. The analog square pulse 602 is received by a digital limiter 308, for example, and is converted to CMOS-compatible square wave feeding the inputs of the PWM generator 226 (e.g., an AND gate). The square wave 604 represents high values with respect to low values, which can correspond to logic zero or logic one. Two digital square waves 604 are combined at an AND gate 226 from the different digital limiters 222 and 224 in order to provide a complete PWM signal.

By designing the active part of the mixed-signal PWM modulator as broadband as possible for a given technology, the performance of the PWM modulator is constant throughout the frequency range of operation—contrary to its all-digital implementation counterpart where the electrical performance rapidly deteriorates with frequency. This is basically due to the fact that the time resolution of the analog delay line is technology agnostic. The output spectrum of the proposed mixed analog-digital PWM device embodiment described herein can comprise both error vector magnitude (EVM) and adjacent channel leakage ratio (ACLR) that are below −47 dBc at a carrier frequency of about 2.65 GHz, for example. In contrast, an all-digital PWM implementation has an EVM is around −30 dBc for a carrier frequency of 1 GHz, but drops below −25 dBc at 2.5 GHz (with similar behavior for ACLR).

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 7:
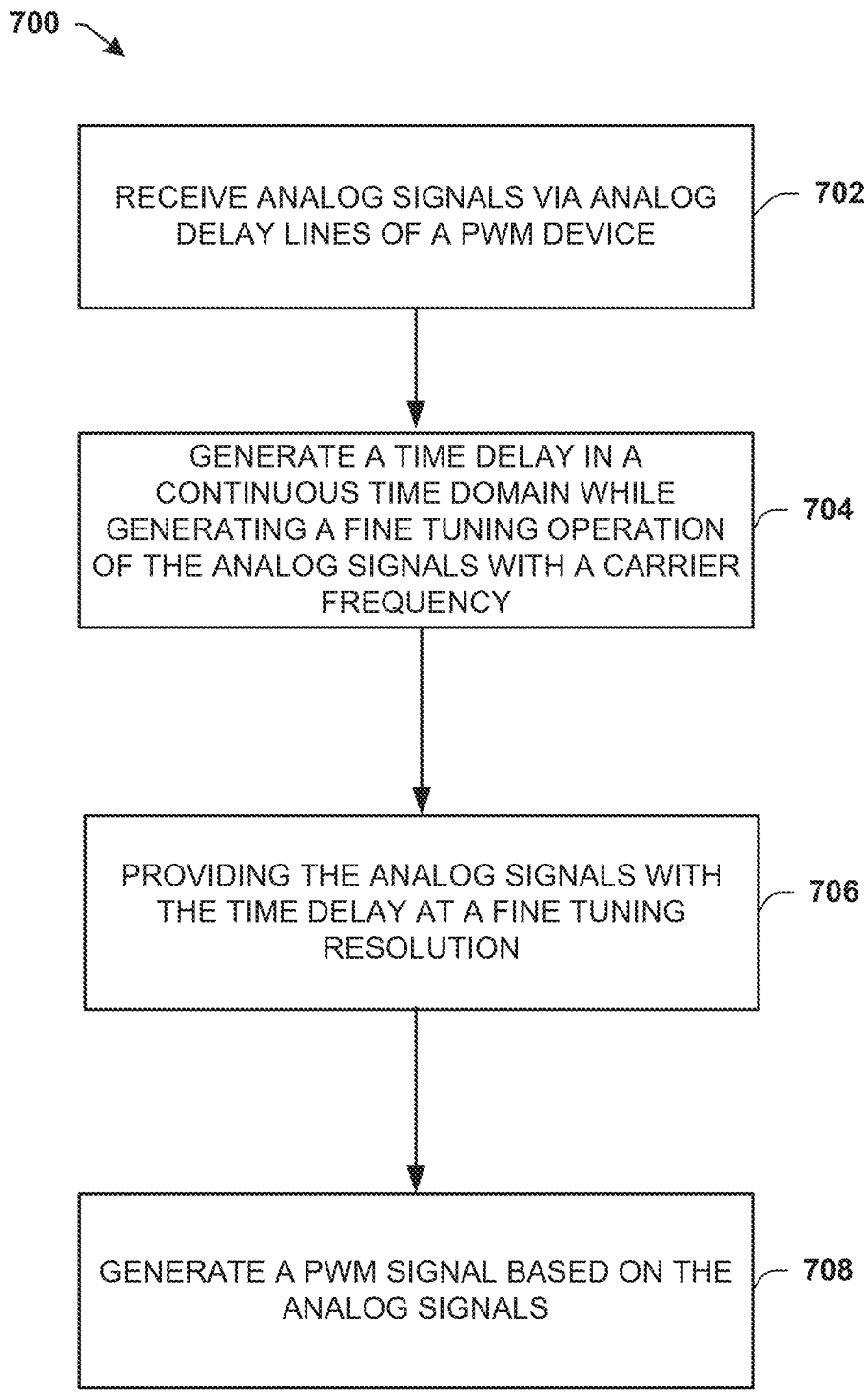
FIG. 7 illustrates a flow diagram of a method for a PWM device in accordance with various aspects described.

Referring to FIG. 7, illustrates an example process flow for generating a PWM signal for transmission in a PWM device in accord with various aspects. The method 700 initiates at 702 with receiving, via a plurality of analog delay lines (e.g., analog delay lines 268-274), analog signals for processing.

At 704, the plurality of analog delay lines generates an offset (e.g., a time or phase delay) to the analog signals in a continuous time or analog domain. The analog delay lines introduce the offset to the analog signals with a single fine tuning operation of the analog signals with a carrier frequency and provide the analog signals with the time delay in a fine tuning resolution that satisfies a predetermined threshold (e.g., with less than 2 picoseconds or less than a picosecond).

At 706, the analog delay lines provide the analog signals with the offset or delay in the resolution to a plurality of digital inverters (e.g., 222, 224, or 308).

At 708, a PWM generation component 226 generates a PWM signal based on the time delay and the resolution for a PWM transmission in response to digital square pulses from one or more digital inverters.

The method can further comprise converting the analog signals with the time delay to analog square pulses that are biased in amplitude, and outputting a digital square wave via a plurality of digital limiters (e.g., limiter components 308).

In further embodiments, the method 700 can include generating a first plurality of quadrature signals of a carrier signal to be processed along different analog delay lines of the plurality of analog delay lines, and generating a second plurality of quadrature signals that are different in a phase shift from the first plurality of quadrature signals of the carrier signal to be processed along different additional analog delay lines of the plurality of analog delay lines.

Figure 8:
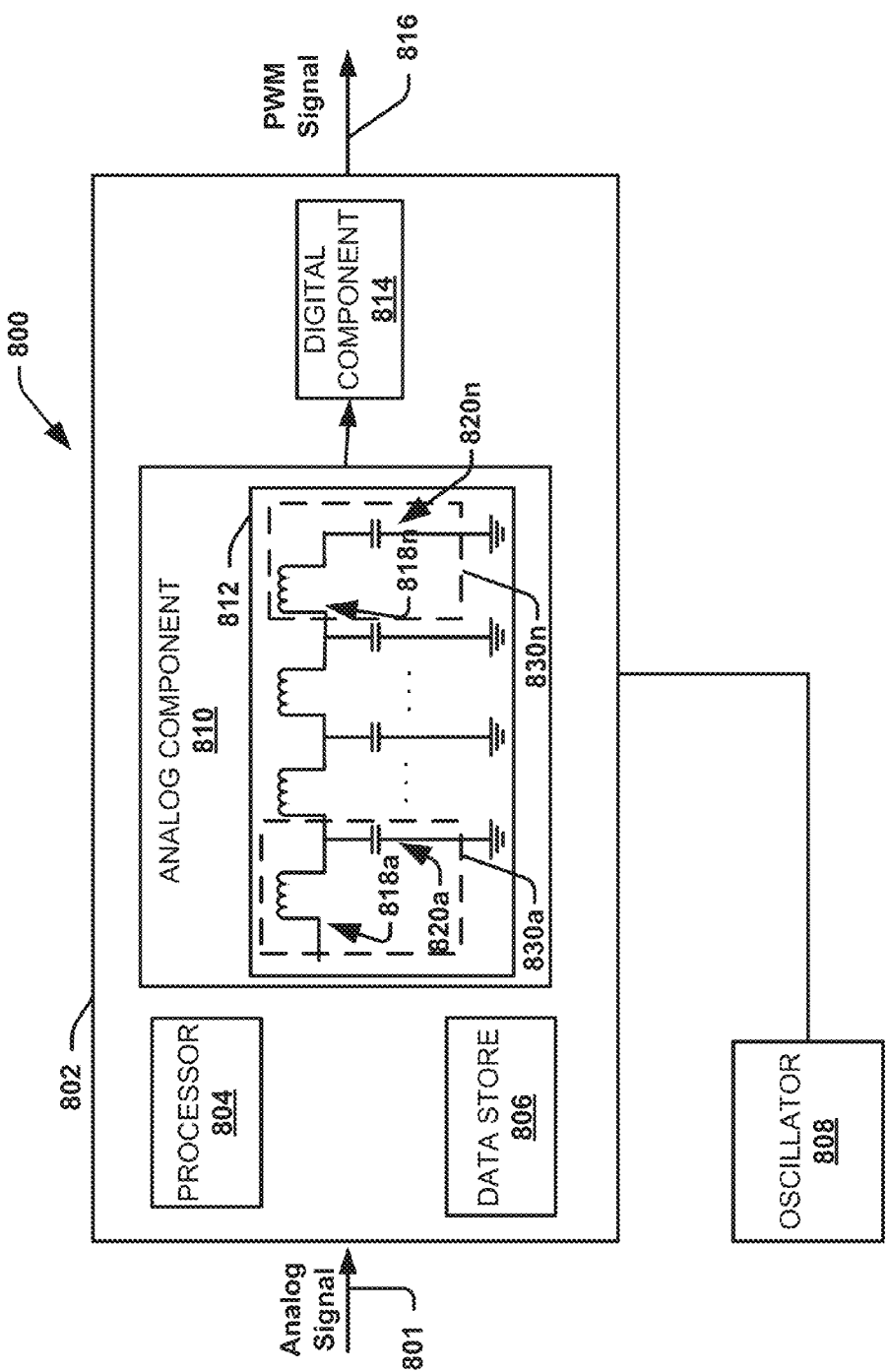
FIG. 8 illustrates an example of a PWM system with an analog component in accordance with various aspects described.

FIG. 8 illustrates an exemplary PWM system 800 at an abstract level that operates to provide an offset (e.g., a time delay or phase offset) to analog input signals while also controlling the resolution of a PWM device 802 in a single hierarchical processing step, or without multiple tuning. Unlike a digital PWM device, the PWM device 802 (e.g., a mixed analog-digital PWM device) processes an analog signal at an input 801 and provides a predetermined or desired time delay according to a reference frequency signal or carrier signal from a local oscillator 806. The PWM modulator device 802 comprises, for example, a processor 804, a data store 806, an oscillator 808, an analog component 810, and a digital component 814, for example, to introduce the time delay with a single tuning operation within the analog time domain.

The processor 804 can be a baseband processor, a controller, digital signal processor, controller, microprocessor or the like to facilitate the processing of signals for communication via the PWM modulator device 802. The data store 806 can store one or more executable instructions, which can be executed via the processor 804 and be used to store a transmission line model, or a modelling profile of a transmission line for processing analog signals in the analog component. The transmission line model, for example, can be a modelling of a continuous wave transmission along a transmission line to establish a set of criteria, which can include offset information, timing data or other information to facilitate PWM processing, such as carrier signal information, time delay steps, or a total device time delay, for example. The model can comprise a set of parameters based on the configuration of the analog delay line 812 and further comprise one or more parameters such as inductances, resistances, capacitances, or other signal transmission properties.

The analog component 810, for example, can receive an oscillator signal from a local oscillator 808 for processing analog signals in a continuous wave or continuous time domain. The analog component 810 can process signals from the local oscillator with different offsets or time delays along a three-hundred sixty (360) degree range with one or more analog delay lines (chains) 812. The analog delay line 812, for example, can selectively introduce a time delay to analog signals based on a dynamic range of the transmitter device or the local oscillator frequency that is changed according to a specific application (e.g., sensor communication, mobile communications, sub-system communications or the like).

In one embodiment, the analog delay line 812 comprises a plurality of analog delay components 830a-830n, which operate to provide the time delay in a tuning resolution that satisfies (falls above or below) a predetermined threshold (e.g., 2 picoseconds or less, such as a fraction of a picosecond). The time delay of the analog signals can be provided by the analog delay line 812 in one operation without a further tuning operation being required, or, in other words, without a dual step operation of course tuning and then a fine tuning process that further increases the resolution of the course tuning in the signal, as often occurs in digital PWM devices. In other words, the analog delay line 812 provides the tuning operation in a one step, one processing hierarchy, or analogy pipeline/chain via the analog delay line component 810. The offset generation also occurs before the analog signals are provided to a digital domain of the PWM device 802 at a digital component 814. The resolution of the time delay for example can be less than 2 picoseconds or less, (e.g., between about 1 picosecond to about 2 picoseconds), or less than one picosecond ($10^{-12}$).

In another embodiment, the resolution can be arbitrarily set depending on the transmission line model. The analog delay line 812, for example, can comprise a number of inductors 818a-818n coupled in series to one another and capacitors or capacitive branches coupled between each pair of inductors and a ground that are connected in parallel configuration to one another, in which each inductor and capacitor can form an analog delay component or an LC delay block (as further detailed and illustrated in FIG. 9).

The inductance values and capacitance values of each inductor 818a-818n and capacitor 820a-820n can be determined based on the modeling of a transmission line configured as the analog delay line 812, and the properties that dictate a transmission of a signal through the transmission line. The model can be implemented dynamically or pre-configured with a set number of passive elements (e.g., inductors, capacitors, resistors or the like) for providing one or more time delays along the analog delay line to the analog input signals with the inductances and capacitances that facilitate transmission through the analog delay line 812 similarly to a transmission line (e.g., current, magnetic field, electric field, voltage, frequency, capacitances, inductors, impedances or the like).

In addition, the analog component 810 can comprise one or more analog delay line components 812, which can generate predetermined or desire small delays at each analog delay component 830 as LC blocks of inductors 818a-818n and capacitors 820a-820n, in which n can represent any desired number. The time delays of each analog digital component 830a-830n correspond to a time constant or switching constant for activation of a particular analog digital component 830a-830n, which can differ or be consistent among one another. Based on the determined time delay for the analog input signals 801, the processor or controller 804 can selectively activate any number of the analog digital components 830a-830n to control the amount of delay being provided to the analog signals in a single tuning operation with a certain resolution (e.g., less than a picosecond, or less than 2 picoseconds). The time delay can be determined by the PWM device 802, for example based on the application, properties of the input signals, or the particular LO frequency or properties of the local oscillator 808 corresponding to the particular application (e.g., telecommunication, sensor data, carrier frequency or the like).

The analog delay line component 812, for example, can comprise one or more analog delay lines corresponding to one or more phase shifts of the local oscillator signal from the local oscillator 808 for processing analog signals in one line or in parallel for different phase shifts. Analog delay lines can be combined, as described above with respect to FIG. 1 or 2 to form different signal outputs downstream via the digital component 814, as part of the digital domain of the PWM signal generation of the device 802. Different sets of processing lines can be combined to form a PWM signal to be transmitted via a PWM processing chain 820, which can include one or more drivers, low pass or other filters, as well as an antenna, for example, as illustrated in the PWM processing path 328. The duty cycle of each the combined processing signals can have a duty cycle, for example, up to or below fifty percent (e.g., 50%), and can be combined to complement one another for the generation of a single PWM signal for transmission.

In another embodiment, the digital component 814 can be configured to receive the analog output signals from the analog component 810 and generate one or more digital square pulses. The digital component 814 generates the one or more digital square pulses with the offset (e.g., time delay) introduced in the analog component 810 while retaining the tuning resolution at the predetermined range or threshold (e.g., about 2 picoseconds or less), which is set in the analog domain via the analog delay line 812 of the analog component 810.

The digital component 814, for example, can comprise one or more digital delay lines or inverters configured to receive the analog output signals from one or more different analog delay lines, and then convert the analog output signals to analog square pulses according to one or more phase shifts. The digital component 814 then outputs a digital square wave from each digital delay line for the subsequent generation of a PWM signal.

The PWM modulator device 802 thus operates to generate a frequency, for example, to synthesize, recover, demodulate, stabilize, or distribute a time pulse for signals in one or more circuits such as a microprocessor or other electronic devices (e.g., a mobile device). The PWM modulator device 802 can be configured to modify, adjust or set a frequency for a phase or time delay based on a single fine tuning operation within a resolution of less than 2 picoseconds, or less than a picosecond, which was set in the analog domain and preserved throughout digital processing.

Figure 9:
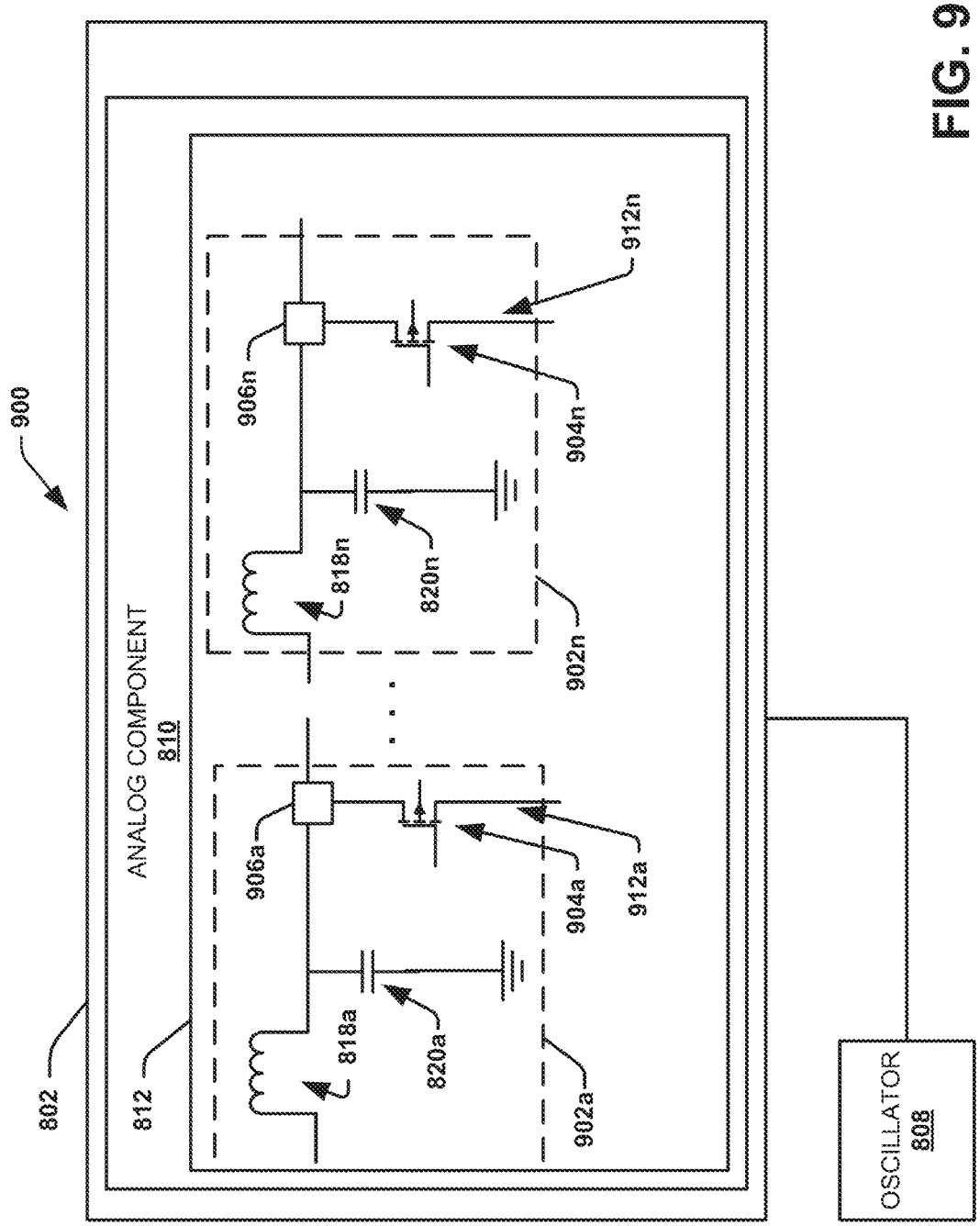
FIG. 9 illustrates an example of an analog delay line of analog component of a PWM device in accordance with various aspects described.

FIG. 9 illustrates an example of the analog delay line 812 of the analog component 810 according to aspects or embodiments being described herein. The analog delay line 812 facilitates a one-step time delay tuning that can be used to construct an effective Pulse-Width Modulator in silicon integrated circuits in a single tuning process. The analog delay line 812 employs tapped analog delay components 902a-902n (LC unit delay blocks) as an analog processing chain within a same substrate that can be selectively tapped to generate and control a time delay to the analog input signals.

Tapping of the analog input signals, for example, can be provided by means of utilizing simple switches 904a-904n, which can comprise one or more transistors (e.g., MOSFET transistors, p-MOS transistors, n-MOS transistors or the like), pole switches, or other switching components operating as switches to selectively activate the analog delay line 812 or analog delay components coupled together in series along the analog delay line 812. The selection of the switches 904a-904n can determine the number of analog delay components 902a-902n activated along the analog delay line 812, and thus the amount of time delay provided to the analog signals being processed.

For example, a time delay could be generated by selectively activating switch 904a at the inter-node or current summing node 906a. Because 904a is a first analog delay component 902a, the time delay could be approximately equal to the time delay of the individual analog delay component only, which is approximately equal to the time constant, RC constant, or frequency response of the activation of the analogy delay component 902a by the switch 904a at the node 906a. A different time delay, for example, can further be provide to the analog delay signals by selectively activating a different analog delay component (e.g., 902n), in which the time delay introduced would be equal to the time constants of each of the analog delay components 902a-902n activated along the analog delay line 812 for processing the analog signals. A point along the analog delay chain can thus be selectively activated at nodes 906a-906n, in which the analog delay components from 902a up to the analog delay component activated can be activated and provide the time delay (e.g., the time constants of the activated components along the analog delay to the point or node of selection). The selection of the current summing node can be based on the analog input signals, a comparison with a local oscillator signal to the input signal of one or more signal properties, or predetermined based on a particular application of the PWM device 802, for example. A simple one-level scheme is thus provided for introducing an offset, such as a time delay to the analog signals so a hierarchical structure (i.e. coarse-fine tune) scheme is avoided and the system does not suffer from memory effects.

In one aspect, signal multiplexing can be provided via any one of the inter-nodes or current summation nodes 906a-906n at the outputs of the MOS switches, in which n can be an integer greater than one. Each current summation node 906a-906n can operate to receive a control or routing signal (e.g., via the processor 804 of FIG. 8) to selectively activate one or more switches 904a-904n, which correspondingly activate each analog delay component 902a-902n along the analog delay chain 812. Each switch 904a-904n can be controlled at a gate terminal, for example, to further drive the switches based on a threshold or control or current signal at the corresponding current summation node 906a-906n.

As discussed above, each analog delay component 902a-902n can comprise a delay that corresponds to the transient or time constant of the analog delay components 902a-902n, which can be defined by corresponding capacitance and inductance values defining the time step. The time constant can be the frequency response (e.g., of a first order time-invariant system) of a particular analog delay component 902a, for example, or, in other words, the time required for a physical quantity or signal change to rise from zero to a portion of its final steady state value in a particular time. The time delay of any one analog delay component 902a-902n can be fixed or predetermined based on a particular application or input signals.

Alternatively, a desired time delay can be determined by the processor or other component based on signal properties of the LO signal of the oscillator 108 and the input signal received, for example. The time delay desired can be then controlled by signaling of a switch 904a-904n at a selected current summation node 906n along the analog delay line 812. The time delay provided to the analog signals can then be based on the cumulative time constants of the analog delay components 902a-902n of the analog delay line 812 having been activated.

In one embodiment, the analog delay line 812 configuration can be completely passive (having only passive electrical components) so that the analog delay line 812 consumes zero power. By replacing the inverter chain of a digital delay element, for example, with the tapped LC blocks (e.g., the analog delay components 902a-902n) based on a transmission line model, the gate delay constant (in the order of picoseconds or less) is essentially replaced by the inductance L and capacitance C values defining the time constant as the time step, and improving the delay resolution greatly.

Figure 10:
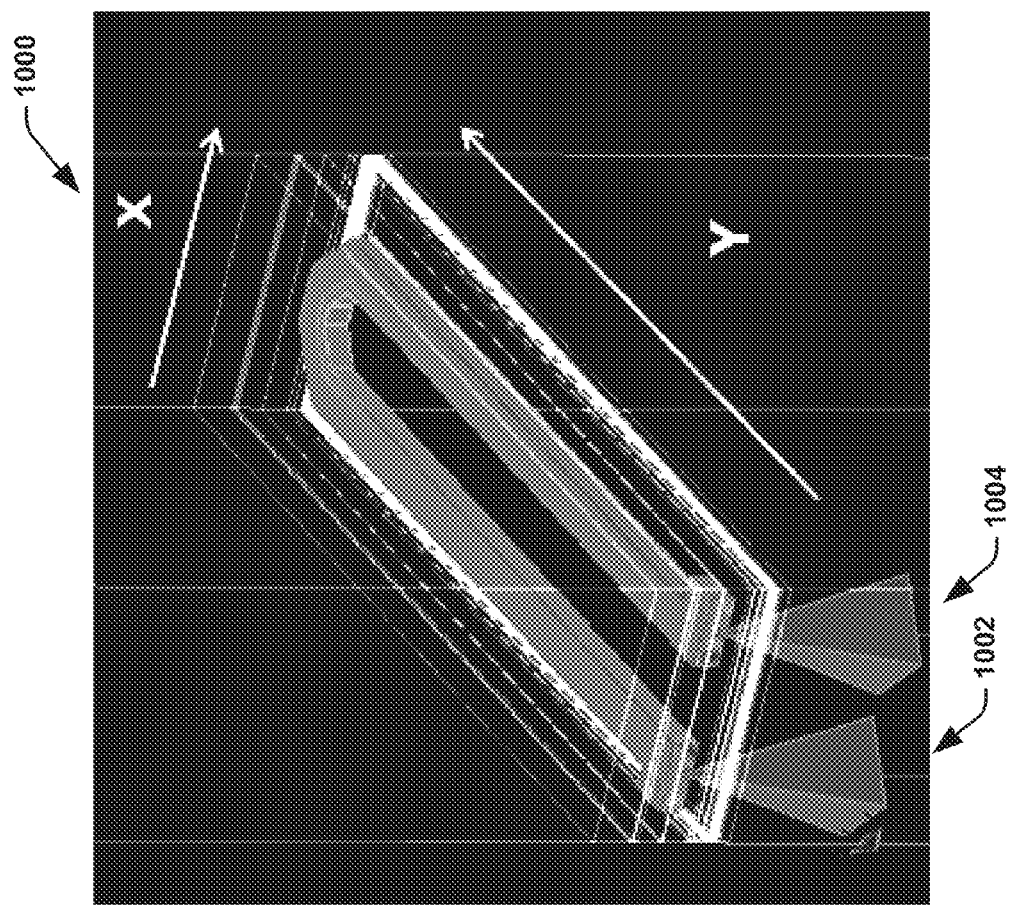
FIG. 10 illustrates an example structure of a pin-hair inductor utilized by the PWM device in accordance with various aspects described.

In another embodiment, the analog delay line (LC time delay chain) 812 is configured with the integrated inductors 818a-818n connected in a daisy chain configuration in series to one another, with each inductor structured as a hair-pin or pin hair inductor. This can provide various advantages, which is further detailed in FIG. 10 with an example pin-hair inductor with a lay out along a horizontal x-axis and a vertical y-axis. These hair-pin inductors comprise U-bents or horse-shoe bent curves along an axis (the x-axis) and can be coupled together in a series or daisy-chain configured in series at the input 1002 and output 1004 (with respective triangles pointing thereto) of each inductor 818a-818n. The U-bent portion can lie at one end of each inductor 818a-818n with respect to the y-axis, while the input 1002 and output 1004 of each inductor 818a-818n can be at an opposite end with respect to the y-axis. The end of the inductor 1000 (e.g., inductor 902a) can comprise the input 1002 and output 1004, forming a horseshoe bend or L-shape leg that can connect to an input of the analog delay line 810, another inductor via a node 906a-906n, or an output of the analog delay chain 812.

The complete analog delay chain 812 of FIGS. 8 and 9 can be implemented in silicon employing the total number of analog delay components 902a-902n in the chain can be determined by (a) the carrier frequency of the communication system opted (signal period T of the input analog (radiofrequency) signal), or (b) the preferred time delay or time step $t_s$ of a particular analog delay component 902a, for example. These two parameters can be utilized to define the total number (N) of analog delay line segments or analog delay component 902a-902n to be implemented or active, in which the number $N=T/t_s$.

Based on the number N of analog delay components or segments of the analogy delay line 812, and the technology fundamental parameter $R_{on} \times C_{off}$, a dominant pole of the low-pass behavior of the analog delay line can be defined: $R_{on} \times C_{off} \times (N-1)$, where N is the number of components activate or implemented along the analog delay line 812, R is the resistance and C is the capacitance during the frequency response of the analog delay component. This pole could affect the spectral purity of the PWM device 812, and so a careful selection of the minimum time step and, hence, the total number of analog delay components or segments for a given carrier frequency is advantageous. Still, the $R_{on} \times C_{off}$ product is significantly smaller than the gate delay for a given digital technology and, in addition, the switch performance of modern nm-scale CMOS processes is comparable to that obtained in expensive III-V technologies.

In one example, Table I below illustrates some indicative $R_{on} \times C_{off}$ products being summarized for different technologies. From Table I it is obvious that plain nm-scale CMOS processes exhibit competitive performance in terms of switching speeds so one does not need to resort to other expensive options. Table I: $R_{on} \times C_{off}$ for different technologies is as follows:

| Technology | $R_{on} \times C_{off}$ (fsec) |
|---|---|
| Monolithic PIN diode | 100-200 |
| GaAs MMIC | 224 |
| CMOS SOI/SOS (0.18 um) | 250 |
| GaN MMIC | 400 |
| Plain CMOS (40 nm) | 200 |

Figure 11:
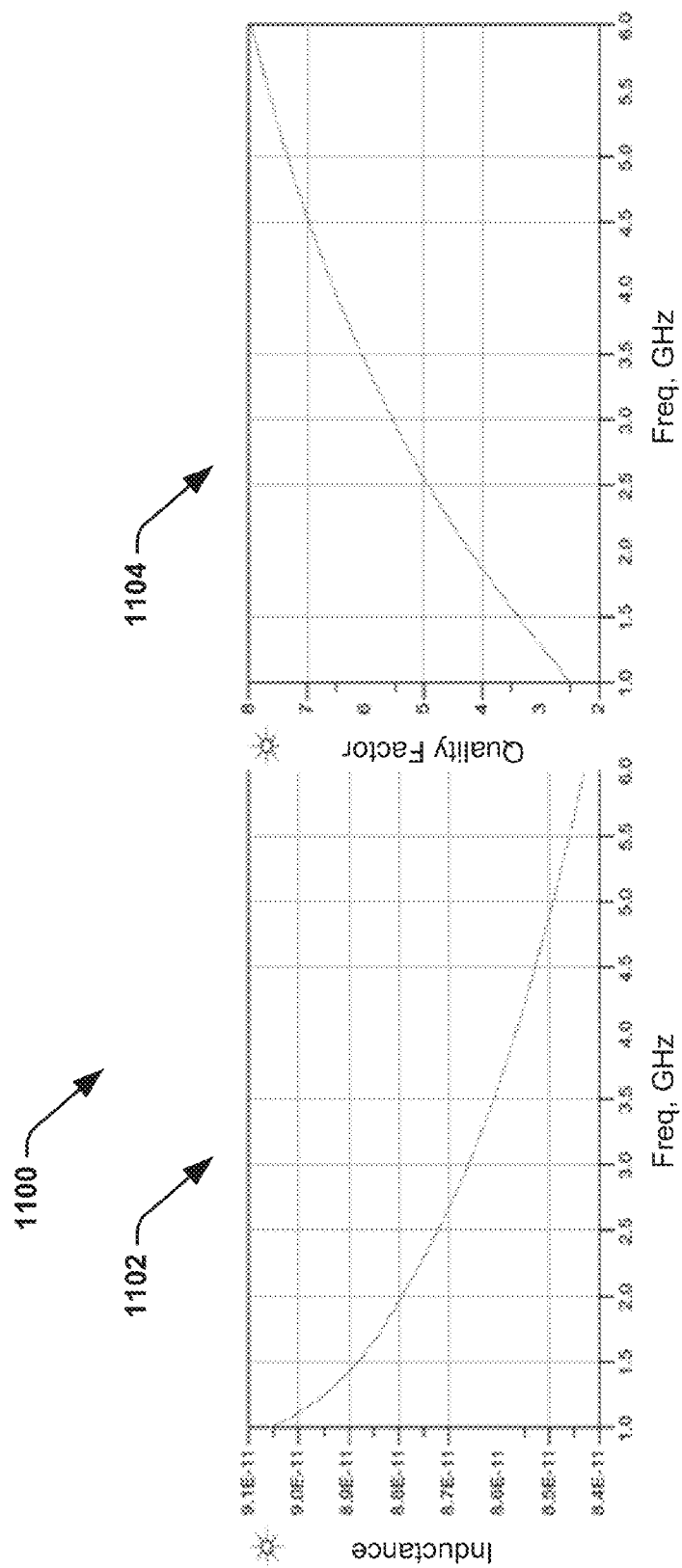
FIG. 11 illustrates example graphs of inductance and quality with respect to frequency for a PWM device in accordance with various aspects described.

FIG. 11 illustrates an example of graphs 1100 of the electrical performance of the integrated inductors forming the various analog delay components in accordance with various embodiments or aspects described herein. The performance of the PWM device 802 of FIGS. 8 and 9, for example, can be seen in the curves 1102 and 1104. Curve 1102, for example, illustrates inductance (e.g., henries) along a vertical y-axis, with the horizontal x-axis representing the frequency in GHz. Curve 1104, for example, illustrates a quality factor along the vertical y-axis, with the horizontal x-axis also representing the frequency in GHz.

The performance of the pin hair inductor can be verified by silicon measurements. For the particular application, the quality factor of the inductor is not as important, as it is a parameter that can describe how under-damped the signal response of the PWM device 802 can be as well as characterizing the bandwidth relative to a center frequency, for example.

In one embodiment, the shape of any one or more of the integrated inductors 818a-818n can be tuned to be optimized for the overall performance of the analog delay line 812. In particular, the analog delay line 812 can comprise an aspect ratio of (Y/X), which can be modified or controlled in order to reduce or increase the size of the inductors 818a-818n and, therefore the size of the overall analog delay line along the Y axis.

In one example, the time constant of the inductors 818a-818n can be modified by only changing the structure (e.g., by elongation or compression) of each inductor in one direction, such as along the Y-axis while maintaining the structure along the X-axis at the same time, for example. Therefore, if the time constant, as well as the corresponding time delay, has to be modified based on the application or change in analog (input) signals being receive, the integrated inductors 818a-818n can be modified only along the Y axis, keeping the main signal and control buses for processing lines, controlling switching activation or node selection intact.

Figure 12:
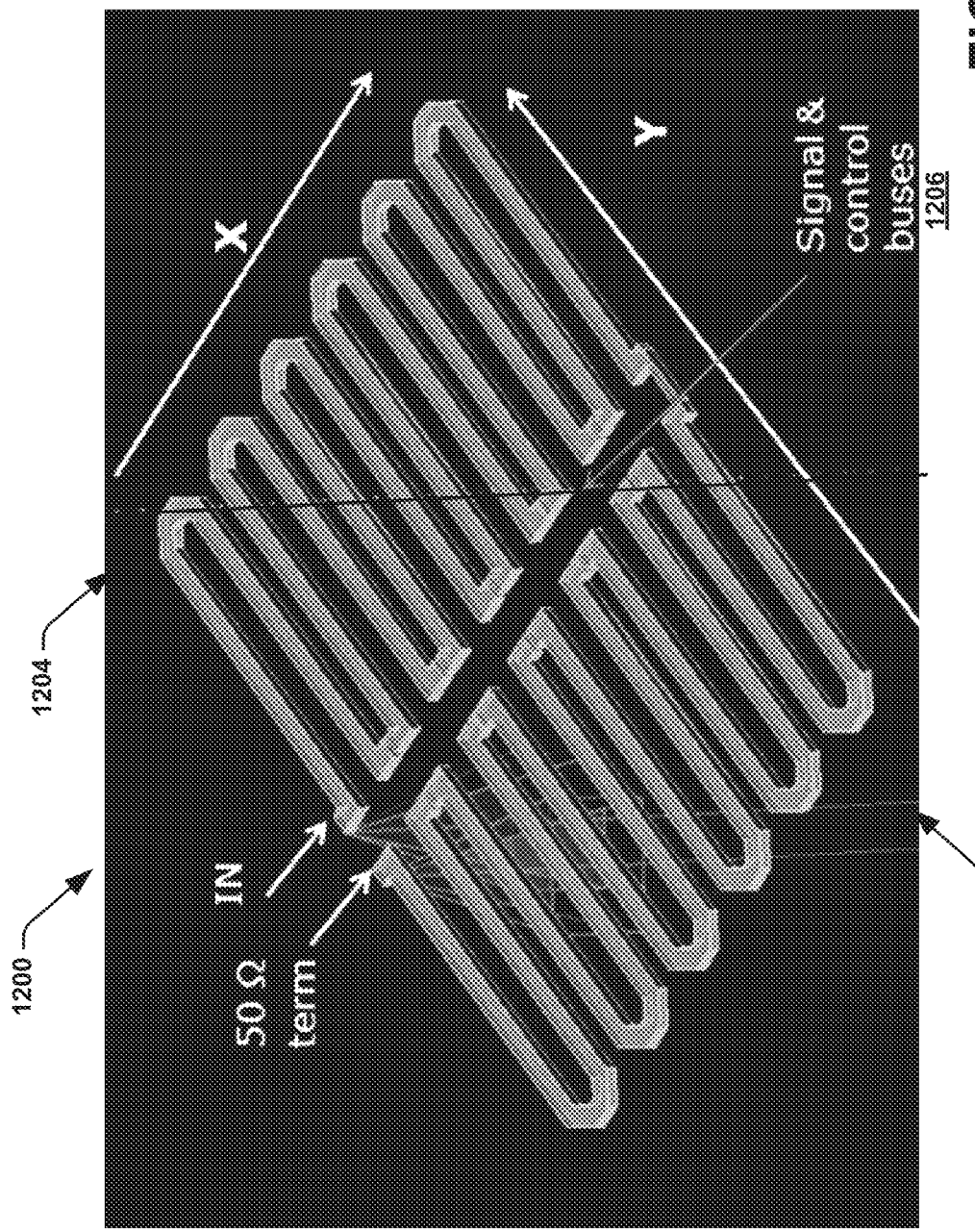
FIG. 12 illustrates an example daisy chain configuration of the inductors in the PWM device in accordance with various aspects described.

FIG. 12 illustrates a topology 1200 of the analog delay line in accordance with various embodiments beings disclosed. The pin-hair inductors (e.g., inductors 818a-818n) can be connected in a 'daisy chain' configuration with the inputs and outputs of each horseshoe shapes, U-bent structure directly connected in series, for example. Obviously, wiring parasitics are significantly reduced with respect to the LC topology employing traditional square or spiral inductors. The hair-pin or pin-hair structure enables maintaining a small time resolution step (below 2 picoseconds, or less than a picosecond for each analog delay component). The layout of the topology 1200 of the analog delay line 812 can make the structure extremely flexible and adaptive: the routing and control signals 1206 can be kept in the middle bus between the mirrored rows of the pin hair inductors so that if the time constant has to be modified, the integrated inductors are modified in structure only along the Y axis, keeping the main signal and control buses intact, as discussed above.

In one embodiment, the inductors 818*a*-818*n* can be structured along mirrored rows 1202 and 1204 that are coupled to one another. Each row 1202 and 1204 of inductors can comprise an approximately equal number of inductors that correspond in number to the total number of analog delay components 902*a*-902*n*, for example, as well as the number of capacitive shunts having capacitors 820*a*-820*n* connected to a ground and an inter-node 906*a*-906*n*.

The inductor rows 1202 and 1204 can mirror one another on a single substrate (e.g., silicon, die, printed circuit board or the like). Each hair-pin inductor can be connected in series or daisy chained at an input and output line at the ends of the U shaped hair pin structure (e.g., a horseshoe shape or U-bent curve), connected in a daisy chain configuration. This structural shaping is in contrast to a traditional (square or octagonal) inductor structure, which can increase wiring parasitics or a decrease performance. In order to overcome this problem, the "pin hair" or "hair pin" inductor structure is employed in a same layer (e.g., a top or metal layer) of the same substrate. The pin-hair inductor provides the required inductance value while limiting a footprint of the PWM device 802 along the X or horizontal axis to a minimum value, hence, allowing for minimum-length wiring, as one advantage. The group delay characteristics of the analog delay components (e.g., N=64) can also operate in the vicinity of 2.5 GHz, for example, in which the analog delay line 812 can exhibit step uniformity and true-time delay behavior over frequency.

Figure 13:
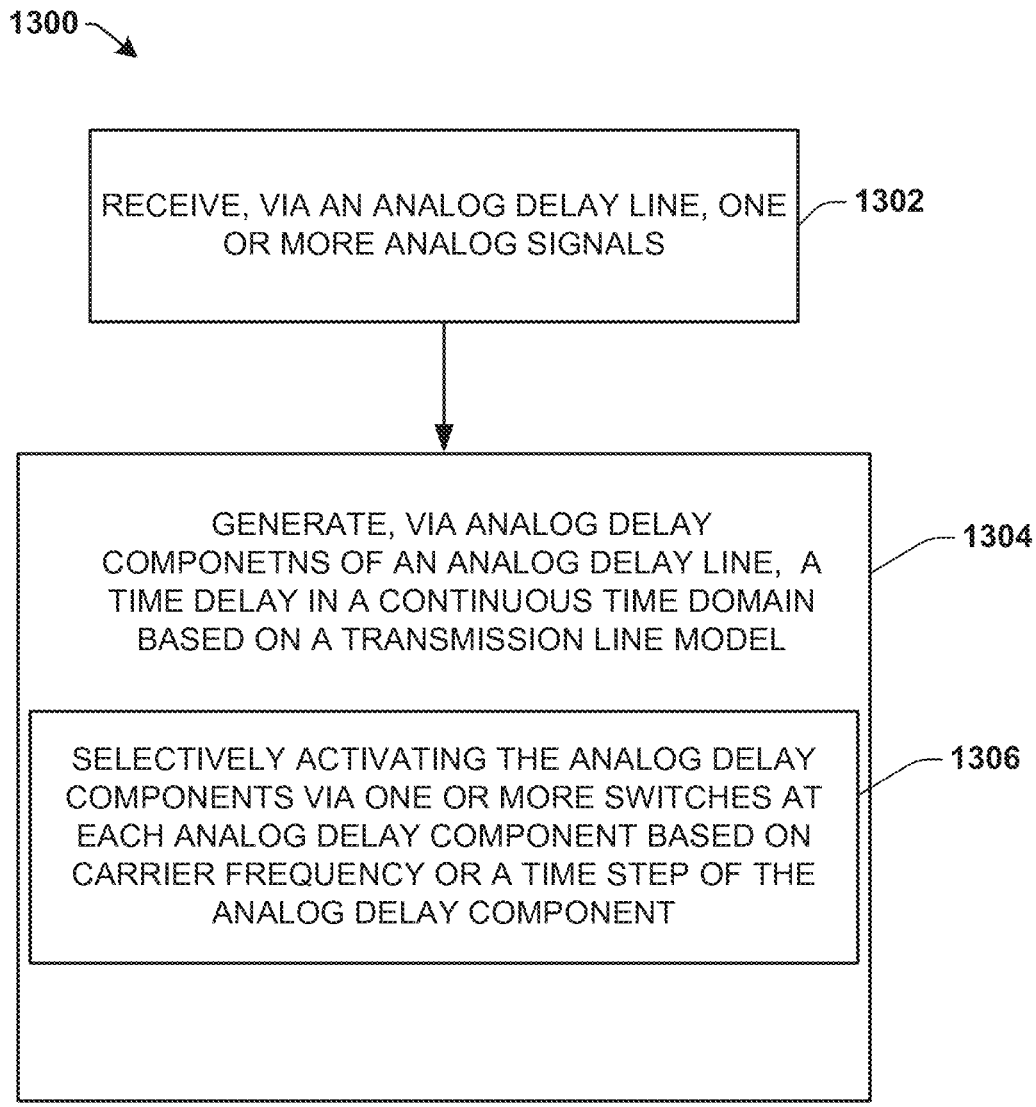
FIG. 13 illustrates another flow diagram of a method for a PWM device in accordance with various aspects described.

FIG. 13 illustrates a method 1300 for a mixed analog-digital PWM device to generate a time delay in the analog domain with a single tuning resolution operation in accordance with aspects described herein. At 1302, the method comprises receiving, via an analog delay line 812 of the mixed analog-digital PWM device 802, one or more analog signals 801.

At 1304, the method further comprises generating, via a plurality of analog delay components 902*a*-902*n* of the analog delay line 812, a time delay to the one or more analog signals in a continuous time domain based on a transmission line model.

At 1306, generation of the time delay can comprise selectively activating the plurality of analog delay components via a plurality of switches coupled between analog delay components of the plurality of analog delay components. The time constant of the plurality of analog delay components can be modified by modifying a structure of the plurality of hair-pin inductors along one axis of the structure of the analog delay line while maintaining the structure constant along another axis of the structure.

The method can further comprise defining, via an analog delay component 902*a* of the plurality of analog delay components 902*a*-902*n*, a time delay step (e.g., $t_s$) at a position along the analog delay line 812 based on an inductance of an inductor (e.g., 818*a*) and a capacitance of a capacitor (e.g., 820*a*) that is based on the transmission line model (e.g., properties of a transmission line resembling a passive electronic structure for signal and circuit values stored in the data store 806).

In another embodiment, the method 1300 can comprise activating a number of the plurality of analog delay components coupled in series along the analog delay line based on a carrier frequency of the PWM device and a predetermined time step of an analog delay component of the plurality of analog delay components. This can include activating a hair-pin inductor with a U-turn bent integrated on a metal layer of a substrate and forming an analog delay component of the plurality of analog delay components within the analog delay line based on an inductance value, the carrier frequency or the time delay step defined by the transmission line model.

Applications (e.g., program modules) can include routines, programs, components, data structures, etc., that perform particular tasks or implement particular abstract data types. Moreover, those skilled in the art will appreciate that the operations disclosed can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated mobile or personal computing devices.

A computing device can typically include a variety of computer-readable media. Computer readable media can be any available media that can be accessed by the computer and includes both volatile and non-volatile media, removable and non-removable media. By way of example and not limitation, computer-readable media can comprise computer storage media and communication media. Computer storage media includes both volatile and non-volatile, removable and non-removable media implemented in any method or technology for storage of information such as computer-readable instructions, data structures, program modules or other data. Computer storage media (e.g., one or more data stores) can include, but is not limited to, RAM, ROM, EEPROM, flash memory or other memory technology, CD ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), CDMA2000, etc. UTRA includes Wideband-CDMA (W-CDMA) and other variants of CDMA. Further, CDMA2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical discs (e.g., compact disc (CD), digital versatile disc (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A mixed analog digital pulse width modulation (PWM) system comprising:
   a PWM device comprising:
      an analog component comprising an analog delay line configured to provide a time delay of one or more analog signals based on a carrier signal of a local oscillator, wherein the analog delay line comprises plurality of analog delay components coupled in series and configured to provide the time delay to the one or more analog signals in a tuning resolution based on a transmission line model, wherein the transmission line model defines capacitance and inductance values of the plurality of analog delay components to selectively provide a time step to the one or more analog signals and generate the time delay along the analog delay line; and
      a digital component configured to provide a PWM signal for transmission based on the one or more analog signals having the time delay.

2. The mixed analog digital PWM system of claim 1, wherein the plurality of analog delay components comprises a plurality of LC delay blocks comprising an inductor and a capacitor connected together and configured to define a time delay step at a position along the analog delay line.

3. The mixed analog digital PWM system of claim 2, wherein the inductor of the plurality of LC delay blocks comprises a hair-pin inductor structured with a U-turn bent integrated on a metal layer of a substrate.

4. The mixed analog digital PWM system of claim 1, wherein a number of the plurality of analog delay components activated along the analog delay line is based on at least one of a carrier frequency of the PWM device or a desired time step of an analog delay component of the plurality of analog delay components.

5. The mixed analog digital PWM system of claim 1, wherein the plurality of analog delay components respectively comprise an inductor of a plurality of inductors coupled in series, and a capacitor of a plurality of capacitors coupled to a node between the plurality of inductors, wherein an inductance value and a capacitance value of an analog delay component of the plurality of analog delay components defines a time step.

6. The mixed analog digital PWM system of claim 1, wherein the plurality of analog delay components comprise only passive components and do not consume power during operation of the PWM device for PWM generation.

7. The mixed analog digital PWM system of claim 1, wherein the analog delay line comprises an analog delay component switch, coupled between pairs of analog delay components of the plurality of analog delay components at a current summation node, configured to generate signal multiplexing of the plurality of analog delay components.

8. The mixed analog digital PWM system of claim 1, wherein the plurality of analog delay components respectively comprise:
   an inductor of a plurality of inductors coupled in series along the analog delay line;
   a capacitor of a plurality of capacitors coupled to a node between the plurality of inductors; and
   a transistor switch of a plurality of transistor switches that is coupled to a current summation node located between the inductor and the capacitor and a multiplexer.

9. The mixed analog digital PWM system of claim 8, wherein the transistor switch is configured to selectively activate an analog delay component of the plurality of analog delay components to provide at least a portion of the time delay at a time delay resolution that satisfies a desired predetermined threshold.

10. The mixed analog digital PWM system of claim 8, wherein the plurality of inductors comprises hair pin inductors connected in a daisy chain and in mirrored rows with respect to one another.

11. A method for a mixed analog-digital PWM device comprising:
   receiving, via an analog delay line of the mixed analog-digital PWM device, one or more analog signals; and
   generating, via a plurality of analog delay components of the analog delay line, a time delay to the one or more analog signals in a continuous time domain based on a transmission line model.

12. The method of claim 11, further comprising:
   defining, via an analog delay component of the plurality of analog delay components, a time delay step at a position along the analog delay line based on an inductance of an inductor and a capacitance of a capacitor that is based on the transmission line model.

13. The method of claim 11, wherein generating the time delay comprises selectively activating the plurality of analog delay components via a plurality of switches coupled between analog delay components of the plurality of analog delay components.

14. The method of claim 11, wherein generating the time delay comprises a single tuning operation in the continuous time domain that generates a tuning resolution that satisfies a predetermined threshold based on a carrier signal from a local oscillator.

15. The method of claim 11, further comprising:
activating a number of the plurality of analog delay components coupled in series along the analog delay line based on a carrier frequency of the PWM device and a predetermined time step of an analog delay component of the plurality of analog delay components.

16. The method of claim 11, further comprising:
activating a hair-pin inductor with a U-turn bent integrated on a metal layer of a substrate and forming an analog delay component of the plurality of analog delay components within the analog delay line based on an inductance value, the carrier frequency and the time delay step defined by the transmission line model.

17. The method of claim 11, further comprising:
modifying a time constant of the plurality of analog delay components comprising a plurality of hair-pin inductors coupled in a daisy chain configuration by modifying a structure of the plurality of hair-pin inductors along one axis of the structure while maintaining the structure constant along another axis of the structure.

18. A mixed analog-digital PWM device comprising:
an analog delay line comprising a plurality of analog delay components coupled together in series via a plurality of inductors, that are configured to provide a time delay to one or more analog signals in a tuning resolution based on a model of a transmission line for transmission of the one or more analog signals.

19. The mixed analog-digital PWM device of claim 18, wherein the plurality of analog delay components further comprise a plurality of capacitor shunts respectively coupled to inter-nodes between the plurality of inductors.

20. The mixed analog digital PWM device of claim 19, wherein the plurality of analog delay components are connected in a daisy chain configuration comprising a plurality of rows that mirror one another in the daisy chain configuration.

21. The mixed analog-digital PWM device of claim 19, wherein the analog delay line further comprises a plurality of switches, coupled in parallel to the plurality of capacitor shunts, configured to selectively activate one or more analog delay components of the plurality of analog delay components to provide the time delay based on a carrier frequency of a local oscillator signal.

22. The mixed analog-digital PWM device of claim 18, wherein the plurality of inductors of the plurality of analog delay components comprise hair-pin inductors comprise a structure with a U-turn bent along an first axis and a second axis, wherein the plurality of inductors is further configured to modify a time delay of the analog delay line by modifying the structure along the second axis while keeping the structure along the first axis constant.

23. The mixed analog-digital PWM device of claim 16, wherein the plurality of analog delay components respectively comprise a time delay step that is a function of a time constant of a transient response generated by a corresponding transistor switch coupled to a current summing node between inductors of the plurality of inductors.

24. The mixed analog-digital PWM device of claim 16, further comprising:
a digital component configured to provide a PWM signal for transmission based on the one or more analog signals having the time delay.

* * * * *